United States Patent
Takagi et al.

(10) Patent No.: US 10,483,302 B2
(45) Date of Patent: Nov. 19, 2019

(54) SOLID-STATE IMAGING DEVICE

(71) Applicant: HAMAMATSU PHOTONICS K.K., Hamamatsu-shi, Shizuoka (JP)

(72) Inventors: Shin-ichiro Takagi, Hamamatsu (JP); Kentaro Maeta, Hamamatsu (JP); Yasuhito Yoneta, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/502,003

(22) PCT Filed: Aug. 3, 2015

(86) PCT No.: PCT/JP2015/071978
§ 371 (c)(1),
(2) Date: Feb. 6, 2017

(87) PCT Pub. No.: WO2016/035494
PCT Pub. Date: Mar. 10, 2016

(65) Prior Publication Data
US 2017/0229501 A1    Aug. 10, 2017

(30) Foreign Application Priority Data
Sep. 1, 2014  (JP) .................. 2014-177195

(51) Int. Cl.
*H01L 27/146* (2006.01)
*H01L 31/02* (2006.01)
(Continued)

(52) U.S. Cl.
CPC .. *H01L 27/14607* (2013.01); *H01L 27/14609* (2013.01); *H01L 27/14638* (2013.01);
(Continued)

(58) Field of Classification Search
CPC ......... H01L 27/14607; H01L 27/14638; H01L 27/14665; H01L 27/14812;
(Continued)

(56) References Cited

U.S. PATENT DOCUMENTS

| | | | |
|---|---|---|---|
| 2010/0045841 A1* | 2/2010 | Otsuka | H01L 27/14601 348/314 |
| 2011/0024607 A1* | 2/2011 | Suzuki | H04N 5/3535 250/208.1 |

(Continued)

FOREIGN PATENT DOCUMENTS

| | | |
|---|---|---|
| CN | 101542734 A | 9/2009 |
| CN | 101981698 A | 2/2011 |

(Continued)

OTHER PUBLICATIONS

English-language translation of International Preliminary Report on Patentability (IPRP) dated Mar. 16, 2017 that issued in WO Patent Application No. PCT/JP2015/071978.

*Primary Examiner* — Caridad Everhart
(74) *Attorney, Agent, or Firm* — Drinker Biddle & Reath LLP

(57) ABSTRACT

A solid-state imaging device includes a plurality of photoelectric converting units and a plurality of charge-accumulating units each accumulating a charge generated in the corresponding photoelectric converting unit. The photoelectric converting unit includes a photosensitive region that generates the charge in accordance with light incidence, and an electric potential gradient forming unit that accelerates migration of charge in a second direction in the photosensitive region. The charge-accumulating unit includes: a plurality of regions (semiconductor layers) having an impurity concentration gradually changed in one way in the second direction, and electrodes adapted to apply electric fields to the plurality of regions. Each of the electrodes is
(Continued)

disposed over the plurality of regions having the impurity concentration gradually varied.

6 Claims, 18 Drawing Sheets

(51) Int. Cl.
    *H01L 27/148* (2006.01)
    *H04N 5/372* (2011.01)

(52) U.S. Cl.
    CPC .. *H01L 27/14643* (2013.01); *H01L 27/14665* (2013.01); *H01L 27/14812* (2013.01); *H01L 27/14831* (2013.01); *H01L 27/14893* (2013.01); *H01L 31/02002* (2013.01); *H04N 5/372* (2013.01); *H01L 27/1464* (2013.01)

(58) Field of Classification Search
    CPC ......... H01L 27/14831; H01L 27/14893; H01L 31/02002; H01L 27/1464
    See application file for complete search history.

(56) References Cited

U.S. PATENT DOCUMENTS

| | | | | |
|---|---|---|---|---|
| 2011/0075005 A1* | 3/2011 | Suzuki | ............. | H01L 27/14831 348/311 |
| 2011/0193137 A1 | 8/2011 | Goto | | |
| 2011/0292067 A1* | 12/2011 | Lee | .................... | H04N 1/00002 345/589 |
| 2011/0292267 A1* | 12/2011 | Yonemura | ......... | H01L 27/14812 348/311 |
| 2013/0221463 A1 | 8/2013 | Okada | | |
| 2013/0270609 A1* | 10/2013 | Takagi | .............. | H01L 27/14612 257/231 |

FOREIGN PATENT DOCUMENTS

| | | |
|---|---|---|
| CN | 103329271 A | 9/2013 |
| EP | 2 093 801 A1 | 8/2009 |
| EP | 2 273 551 A1 | 1/2011 |
| EP | 3 067 934 A1 | 9/2016 |
| JP | S61-194780 A | 8/1986 |
| JP | H06-104417 A | 4/1994 |
| JP | H06-236987 A | 8/1994 |
| JP | 2002-373979 A | 12/2002 |
| JP | 2004-303982 A | 10/2004 |
| JP | 2007-258424 A | 10/2007 |
| JP | 2009-272333 A | 11/2009 |
| JP | 2011-187921 A | 9/2011 |
| JP | 2012-151364 A | 8/2012 |
| JP | 2015-090907 A | 5/2015 |

* cited by examiner (a)

(b)

(a)

(b)

(a)

(b)

SOLID-STATE IMAGING DEVICE

TECHNICAL FIELD

The present invention relates to a solid-state imaging device.

BACKGROUND ART

Known solid-state imaging devices include a plurality of photoelectric converting units aligned in a first direction; a plurality of charge-accumulating units, each being aligned with the corresponding photoelectric converting unit in a second direction orthogonal to the first direction, and each being adapted to accumulate a charge generated in the corresponding photoelectric converting units; and a charge-output unit adapted to obtain charges respectively transferred from the plurality of charge-accumulating units, and transfer in the first direction, to output the charges (refer to Patent Literature 1, for example). In the solid-state imaging device disclosed in Patent Literature 1, the charge-accumulating units each include at least two gate electrodes disposed in the second direction and each applied with a predetermined electric potential so as to increase a potential in the second direction.

CITATION LIST

Patent Literature

Patent Literature 1: Japanese Unexamined Patent Publication No. 2012-151364

SUMMARY OF INVENTION

Technical Problem

In a solid-state imaging device described above, preferably, a saturation charge quantity in each charge-accumulating unit is increased in order to enlarge a dynamic range and improve an SN ratio. In this case, the saturation charge quantity of the charge-accumulating unit can be increased by enlarging a size in a second direction of the charge-accumulating unit. The more the size in the second direction of the charge-accumulating unit is enlarged, the longer transfer time of the charge accumulated in the charge-accumulating unit becomes. Increase of the transfer time of the charge may be a factor to inhibit speed-up of charge transfer in the solid-state imaging device, namely, speed-up of imaging. In the case of shortening the transfer time of the charge because of a constraint to speed up the charge transfer, the charge may not be transferred and remain in the charge-accumulating unit. As a result, a residual image (image lag) may be generated. Thus, increase of the saturation charge quantity and speed-up of the charge transfer are mutually in a tradeoff relation.

A request to increase the saturation charge quantity and speed up the charge transfer is growing more and more. According to the study made by the inventors of the present invention, there is still room for improvement in terms of achieving both increase of the saturation charge quantity and speed-up of the charge transfer even in the solid-state imaging device disclosed in Patent Literature 1.

An aspect of the present invention is directed to providing a solid-state imaging device capable of achieving both increase of a saturation charge quantity and speed-up of charge transfer at a high level.

Solution to Problem

One aspect of the present invention is a solid-state imaging device that includes a plurality of photoelectric converting units aligned in a First direction; a plurality of charge-accumulating units, each being aligned with the corresponding photoelectric converting unit in a second direction orthogonal to the first direction, and each being adapted to accumulate a charge generated in the corresponding photoelectric converting unit; and a charge-output unit adapted to obtain charges respectively transferred from the plurality of charge-accumulating units, and transfer in the first direction, to output the charges. Each of the photoelectric converting units includes: a photosensitive region adapted to generate the charge in accordance with light incidence; and an electric potential gradient forming unit adapted to form, for the photosensitive region, an electric potential gradient increasing along the second direction, and accelerate migration of the charge in the second direction in the photosensitive region. Each of the charge-accumulating units includes a plurality of regions in which an impurity concentration is gradually changed in one way in the second direction; and an electrode disposed over the plurality of regions in which the impurity concentration is gradually varied, and adapted to apply an electric field to the plurality of regions.

In the charge-accumulating unit, a potential depth in a region immediately below the electrode is adjusted by an electric field applied by the electrode. An electric field generated in a middle portion in the second direction of the electrode (e.g., central portion in the second direction) is weaker than an electric field generated at an end portion in the second direction of the electrode. Therefore, the potential depth in the region immediately below the middle portion of the electrode is not properly adjusted. In which case, migration of the charge in the second direction cannot be sufficiently accelerated, and transfer time of the charge may be increased. Additionally, size enlargement in the second direction of the charge-accumulating unit (increase of saturation charge quantity) may be inhibited.

In the one aspect, the charge-accumulating unit includes the plurality of regions in which the impurity concentration is gradually changed in one way in the second direction, and the electrode included in the charge-accumulating unit is disposed over the plurality of regions in which the impurity concentration is gradually varied. Therefore, even in the case where an electric field formed in the middle portion in the second direction of the electrode is weak, the potential depth in the region immediately below the middle portion of the electrode is properly adjusted because the impurity concentration is gradually changed in one way in the region immediately below the middle portion. Consequently, migration of the charge in the second direction is sufficiently accelerated, and the transfer time of the charge is shortened. Additionally, size enlargement in the second direction of the charge-accumulating unit (increase of saturation charge quantity) is prevented from being inhibited.

The charge-accumulating unit may include a first region and a second region aligned in the second direction as the plurality of regions, and the impurity concentration may be gradually changed in one way in the first region and the second region by implanting impurities in the first region and the second region and additionally implanting the impurities in the second region having been implanted with the impurities. In which case, the plurality of regions in which the impurity concentration is gradually changed in one way in the second direction can be easily implemented.

The second region may be adjacent to the photosensitive region in the second direction, and the photosensitive region may have an impurity concentration same as that of the second region by implanting the impurities along with the second region. In which case, a barrier or a well of the potential is hardly formed between the photosensitive region and the second region adjacent to each other in the second direction. Therefore, charge transfer from the photosensitive region to the charge-accumulating unit can be prevented from being inhibited.

The solid-state imaging device may include a plurality of charge-discharging units, each being aligned with the corresponding charge-accumulating unit in the first direction, and each being adapted to discharge the charge accumulated in the charge-accumulating unit. In which case, for example, in the case where charge exceeding accumulation capacity of the charge-accumulating unit are generated in the charge-accumulating unit, the charge exceeding the accumulation capacity can be discharged by the charge-discharging unit. Consequently, the charge exceeding the accumulation capacity and overflowed from the charge-accumulating unit can be prevented from being leaked to another charge-accumulating unit, so-called blooming.

Each of the charge-accumulating units may have a width becoming larger in the first direction as a position advances in the second direction. In which case, the charge-discharging unit can be disposed without inhibiting flow of charge in the second direction from. the charge-accumulating unit.

Each of the charge-discharging units may include a drain region adapted to discharge a charge, a gate region located between the charge-accumulating unit and the drain region and adapted to control flow of the charge into the drain region from the charge-accumulating unit, and the drain region may be shared between the charge-discharging units adjacent to each other in the first direction. In which case, space saving for the charge-discharging units can be achieved.

Advantageous Effects of Invention

According to the one aspect of the present invention, it is possible to provide a solid-state imaging device capable of achieving both increase of the saturation charge quantity and speed-up of the charge transfer at a high level.

DESCRIPTION OF EMBODIMENTS

The preferred embodiments of the present invention will be described below in detail with reference to the accompanying drawings. In the description, the same elements or elements with the same function will be denoted by the same reference signs, omitting overlapping description.

Figure 1:
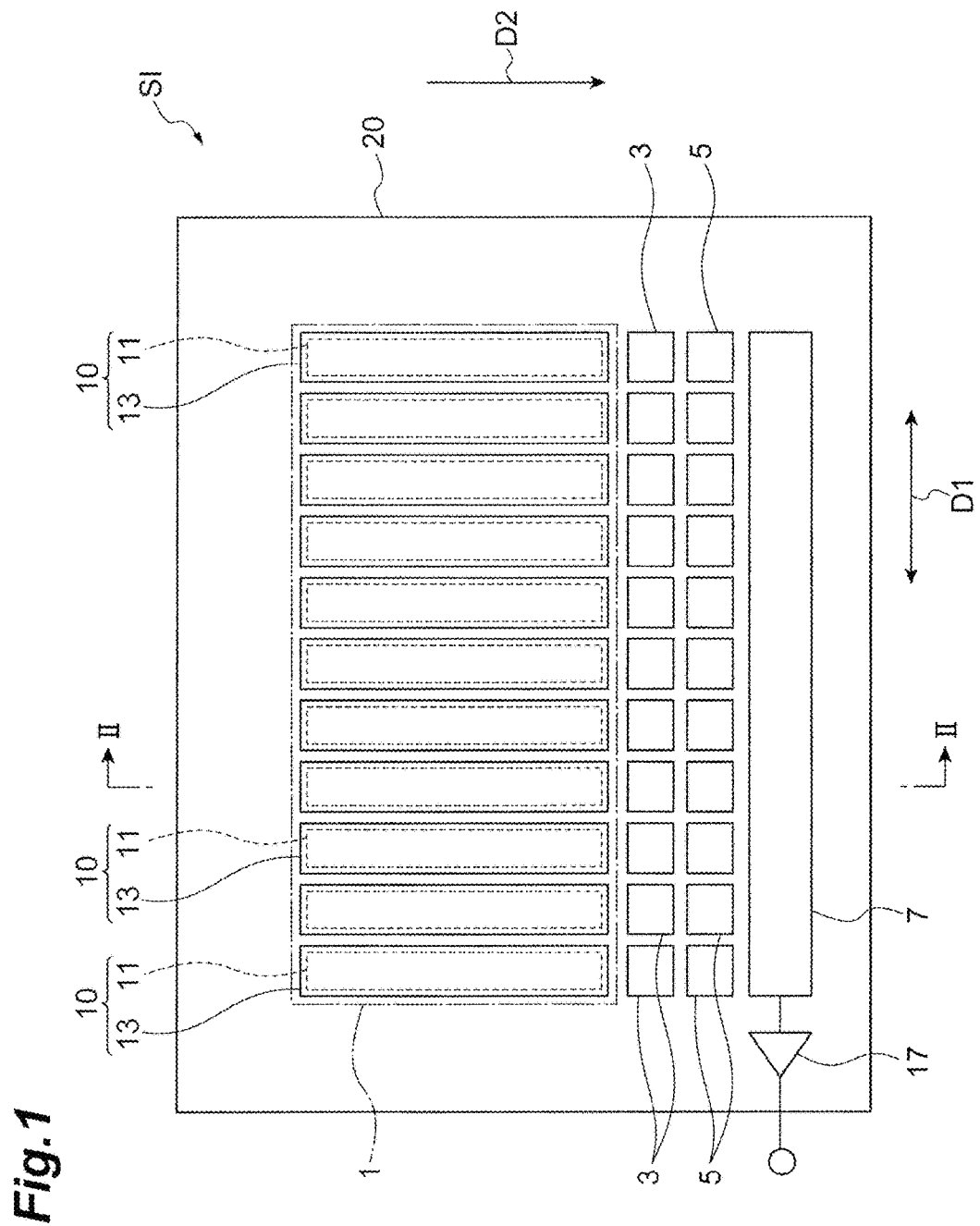
FIG. 1 is a diagram illustrating a plane configuration of a solid-state imaging device according to an embodiment.
Figure 2:
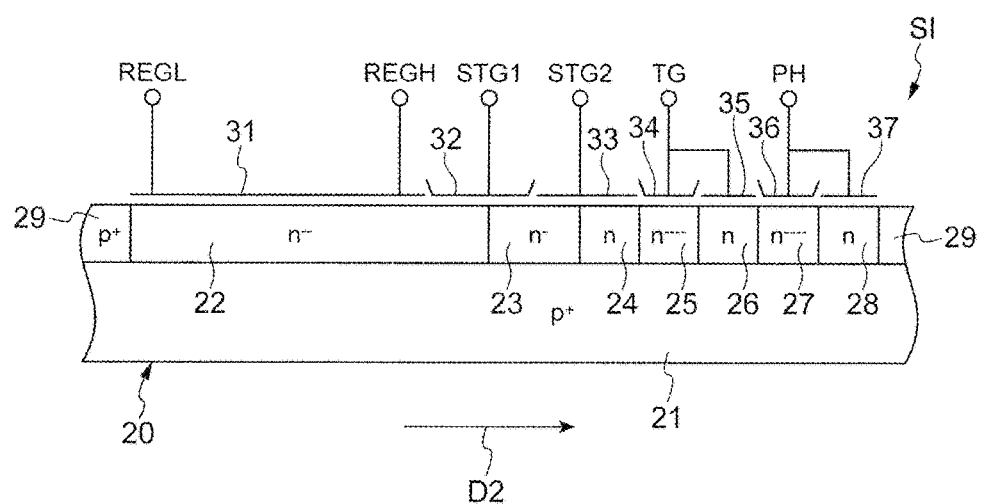
FIG. 2 is a schematic diagram illustrating a sectional configuration along a line II-II in FIG. 1.
Figure 3:
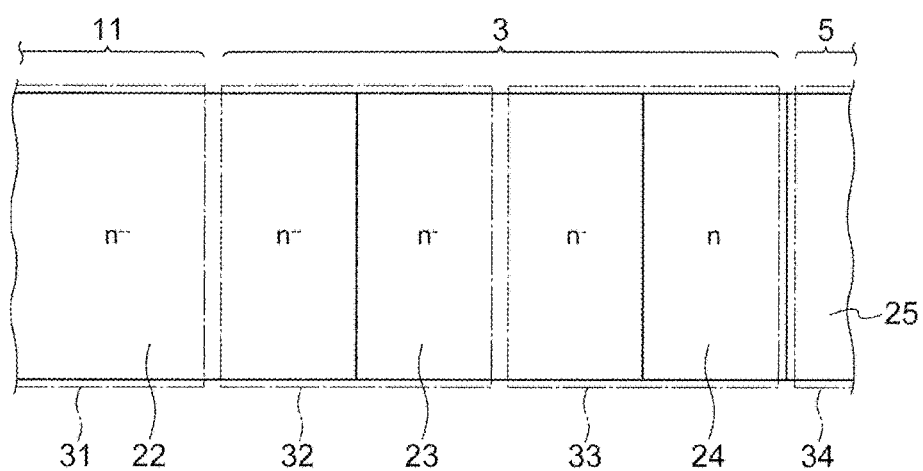
FIG. 3 is a diagram for explaining a configuration of a storage unit.
Figure 4:
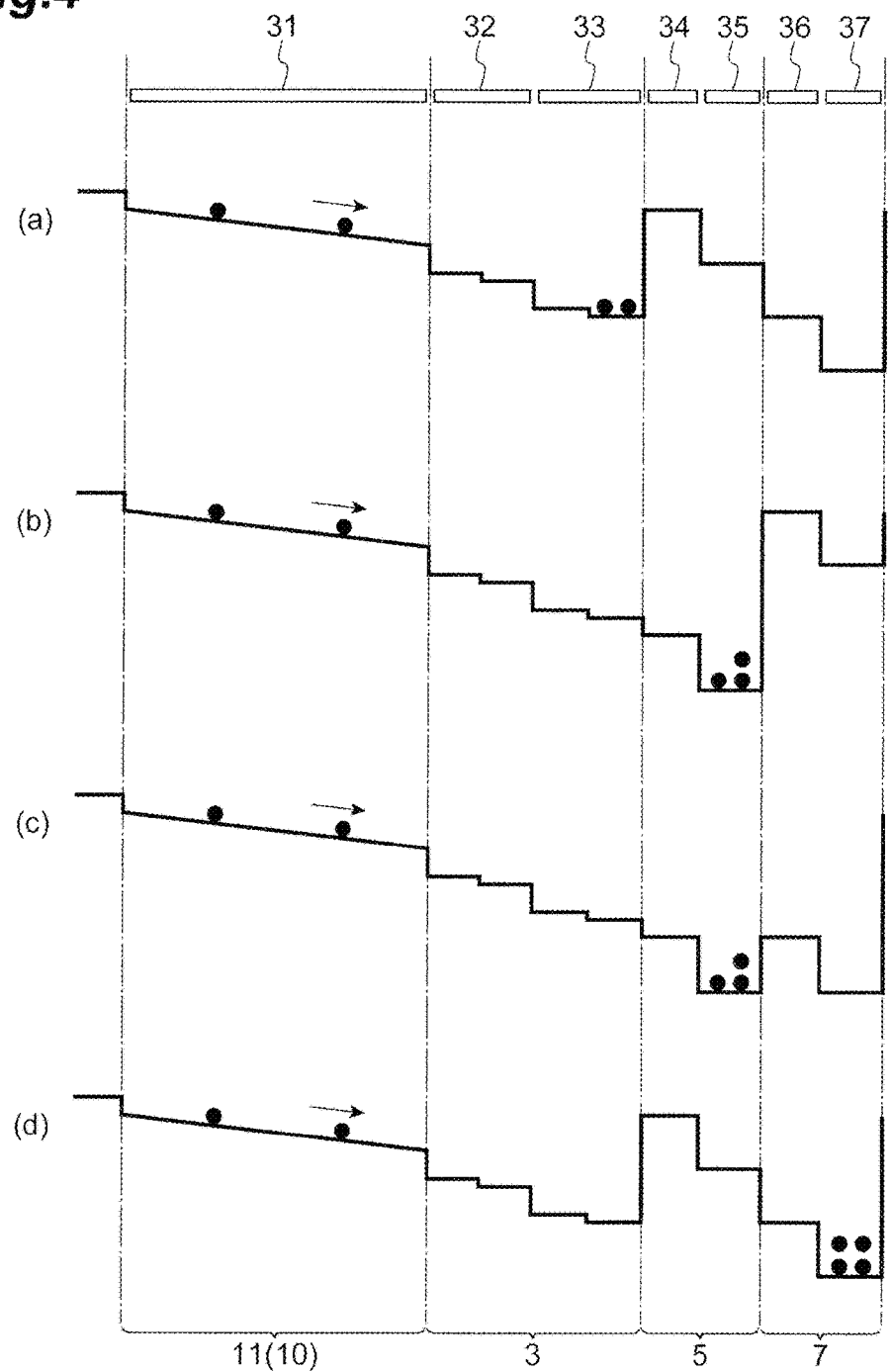
FIG. 4 is a diagram for explaining change of a potential formed in the solid-state imaging device according to the present embodiment.

A solid-state imaging device SI according to the present embodiment will be described with reference to FIGS. 1 to 4. FIG. 1 is a diagram illustrating a plane configuration of the solid-state imaging device according to the present embodiment. FIG. 2 is a schematic diagram illustrating a sectional configuration along a line II-II in FIG. 1. FIG. 3 is a diagram for explaining a configuration of a storage unit. FIG. 4 is a diagram for explaining change of a potential formed in the solid-state imaging device according to the present embodiment. In FIG. 4, a downward direction in the drawing indicates a positive direction of the potential. A black circle in FIG. 4 indicates a charge.

As illustrated in FIG. 1, the solid-state imaging device SI includes a light receiving unit 1, a plurality of storage units 3, a plurality of transfer units 5, and a shift register 7 as a charge-output unit. The solid-state imaging device SI is a back-thinned (BT)-CCD linear image sensor.

The light receiving unit 1 includes a plurality of photoelectric converting units 10. The plurality of photoelectric converting units 10 is aligned in a first direction D1. Each of the plurality of photoelectric converting units 10 includes a photosensitive region 11 and an electric potential gradient forming unit 13. In other words, the light receiving unit 1 includes a plurality of the photosensitive regions 11 and a plurality of the electric potential gradient forming units 13.

The photosensitive region 11 generates a charge according to an intensity of incident light in response to light incidence. A plane shape of the photosensitive region 11 has a rectangular shape formed of two long edges and two short edges. The plurality of photosensitive regions 11 is aligned in the first direction D1. In the present embodiment, the first direction D1 is a direction along a short edge direction of the photosensitive region 11. The plurality of photosensitive regions 11 is disposed in one-dimensional direction by setting the first direction D1 as the one-dimensional direction. One photosensitive region 11 constitutes one pixel in the light receiving unit 1. In the present embodiment, FIG. 1, a direction from a right side to a left side in and a direction from the left side to the right side correspond to the first direction D1.

Each of the electric potential gradient forming units 13 is disposed in a manner corresponding to each of the respective photosensitive regions 11. The electric potential gradient forming unit 13 forms, for the corresponding photosensitive region 11, an electric potential gradient increasing along a second direction D2 that intersects with the first direction D1. In the present embodiment, the first direction D1 is orthogonal to the second direction D2, and the second direction D2 is a direction along a long edge direction of the photosensitive region 11 and is directed from one short edge to another short edge. The charge generated in the photosensitive region 11 is discharged from the other short edge side of the photosensitive region 11 by the electric potential gradient forming unit 13. In other words, the electric potential gradient forming unit 13 forms the electric potential gradient that is made higher on the other short edge side of the photosensitive region 11 than that on the one short edge side of the photosensitive region 11.

Each of the storage units 3 corresponds to each of the photosensitive regions 11 and is disposed on the other short edge side of the photosensitive region 11. In other words, the plurality of storage units 3 is disposed to be aligned with the photosensitive regions 11 (photoelectric converting units 10) in the second direction D2 on the other short edge side of the photosensitive region 11. The storage unit 3 is located between the photosensitive region 11 and the transfer unit 5. In the present embodiment, the charge discharged from the photosensitive region 11 by the electric potential gradient forming unit 13 is accumulated in the storage unit 3. The charge accumulated in the storage unit 3 is transferred to the corresponding transfer unit 5. The storage unit 3 functions as a charge-accumulating unit. In other words, the solid-state imaging device SI includes a plurality of the charge-accumulating units.

Each of the transfer units 5 corresponds to each of the storage units 3 and is disposed between the corresponding storage unit 3 and shift register 7. In other words, the plurality of transfer units 5 is disposed to be aligned with the storage unit 3 in the second direction D2 on the other short edge side of the photosensitive region 11. The transfer unit 5 is located between the storage unit 3 and the shift register 7. The transfer unit 5 obtains the charge accumulated in the storage unit 3, and transfers the obtained charge to the shift register 7.

The shift register 7 is disposed to interpose each of the transfer units 5 with each of the storage units 3. in other words, the shift register 7 is disposed on the other short edge side of the photosensitive region 11. The shift register 7 obtains the charge transferred from each of the transfer units 5, transfers the charge in the first direction D1, and sequentially outputs the charge to an output stage 17. The charge output from the shift register 7 is converted to a voltage by the output stage 17, and output to the outside of the solid-state imaging device SI as the voltage of each photosensitive region 11. The output stage 17 is included, for example, a floating diffusion amplifier (FDA) and the like.

Isolation regions are disposed between the adjacent photosensitive regions 11, between the adjacent storage units 3, and between the adjacent transfer units 5. The isolation regions enable electric isolation between the photosensitive regions 11, between the storage units 3, and between the transfer units S respectively.

As illustrated in FIG. 2, the light receiving unit 1, plurality of storage units 3, plurality of transfer units 5, and shift register 7 are formed on a semiconductor substrate 20. In other words, the solid-state imaging device SI includes the semiconductor substrate 20.

The semiconductor substrate 20 includes a p type semiconductor layer 21 to be a base of the semiconductor substrate 20, an $n^{--}$ type semiconductor layer 22, an $n^{-}$ type semiconductor layer 23, n type semiconductor layers 24, 26, 28, $n^{----}$ semiconductor layers 25, 27, and a $p^+$ type semiconductor layer 29 that are formed on one surface side of the p type semiconductor layer 21. In the present embodiment, a silicon substrate is used as the semiconductor substrate 20. Respective conductivity types of the p type and the n type may be switched to conductivity types opposite to the above-described ones.

"+" marked behind the conductivity type indicates a high impurity concentration. "−" marked behind the conductivity type indicates a low impurity concentration. The low impurity concentration includes an aspect in which a low impurity concentration is apparently obtained by part of impurities having the conductivity type marked with "−" being compensated with impurities having the conductivity type opposite to the conductivity type marked with "−".

The number of "−" indicates a concentration level of the impurities having the conductivity type marked with the "−". The more the number of "−" is, the lower the concentration of the impurities having the conductivity type marked with the "−" is. Examples of the n type impurities are N, P, As, or the like. Examples of the p type impurities are B, Al, or the like.

The p type semiconductor layer 21 and the $n^{--}$ type semiconductor layer 22 form a pn junction, and the $n^{--}$ type semiconductor layer 22 constitutes the photosensitive region 11 adapted to generate the charge by light incidence. The $n^{--}$ type semiconductor layer 22 has a rectangular shape formed of two long edges and two short edges in a planar view. The $n^{--}$ type semiconductor layers 22 are aligned in the first direction D1 and located like an array form in one-dimensional direction. In other words, the respective $n^{--}$ type semiconductor layers 22 are aligned in a direction along a short edge direction of the $n^{--}$ type semiconductor layer 22. The above-described isolation region can he formed of a $p^+$ type semiconductor layer.

An electrode 31 is disposed for the $n^{--}$ type semiconductor layer 22. The electrode 31 is formed on the $n^{--}$ type semiconductor layer 22 via an insulation layer (not illustrated in FIG. 2). The electrode 31 constitutes the electric potential gradient forming unit 13. The electrode 31 constitutes a so-called resistive gate electrode and is formed in a manner extending in the second direction D2.

The electrode 31 has both ends (REGL, REGH) in the second direction D2 provided with an electric potential difference, thereby forming an electric potential gradient in accordance with to electric resistance components in the second direction D2 of the electrode 31. In other words, the electrode 31 forms the electric potential gradient increasing along the second direction D2. A potential inclination is formed by the electric potential gradient in a region immediately below the electrode 31 in the $n^{--}$ type semiconductor layer 22 as illustrated in FIG. 4. The charge generated in the $n^{--}$ type semiconductor layer 22 in accordance with light incidence migrates in the second direction D2 along the potential inclination in the region immediately below the electrode 31.

An electrode 32 is disposed for the type semiconductor layer 22 and the n⁻ type semiconductor layer 23 as illustrated in FIG. 3. The electrode 32 is adjacent to the electrode 31 in the second direction D2. The electrode 32 is formed on the n⁻⁻ type semiconductor layer 22 and the n⁻ type semiconductor layer 23 via an insulation layer (not illustrated in FIG. 3) to be disposed over the n⁻⁻ type semiconductor layer 22 and the n type semiconductor layer 23. The n⁻ type semiconductor layer 23 is adjacent to the n⁻⁻ type semiconductor layer 22 in the second direction D2.

An electrode 33 is disposed for the n⁻ type semiconductor layer 23 and the n type semiconductor layer 24. The electrode 33 is adjacent to the electrode 32 in the second direction D2. The electrode 33 is formed on the n⁻ type semiconductor layer 23 and the n type semiconductor layer 24 via an insulation layer (not illustrated in FIG. 3) to be disposed over the n⁻ type semiconductor layer 23 and the n type semiconductor layer 24. The n type semiconductor layer 24 is adjacent to then type semiconductor layer 23 in the second direction D2.

A voltage (STG1) higher than voltages applied to both ends of the electrode 31 is applied to the electrode 32. A voltage (STG2) higher than voltages applied to both ends of the electrode 32 is applied to the electrode 33. Therefore, a potential in a region immediately below the electrode 32 in the n⁻⁻ type semiconductor layer 22 and the n⁻ type semiconductor layer 23 and a potential in a region immediately below the electrode 33 in the n⁻ type semiconductor layer 23 and the n type semiconductor layer 24 are lower than a potential in a region immediately below the electrode 31 in the n⁻⁻ type semiconductor layer 22. Therefore, charge migrating along the potential inclination in the region immediately below the electrode 31 flows into a potential well formed in the region immediately below the electrode 32 and the electrode 33, and are stored in the potential well.

The region immediately below the electrode 32 in the n⁻⁻ type semiconductor layer 22 has a p type impurity concentration higher than that of the region immediately below the electrode 32 in the n⁻ type semiconductor layer 23. In other words, the region immediately below the electrode 32 in the n type semiconductor layer 23 apparently has an n type impurity concentration higher than that of the region immediately below the electrode 32 in the n⁻⁻ type semiconductor layer 22. Therefore, the potential in the region immediately below the electrode 32 in the n⁻ type semiconductor layer 23 is lower than the potential in the region immediately below the electrode 32 in the n⁻⁻ type semiconductor layer 22.

The region immediately below the electrode 32 in the n type semiconductor layer 23 and the region immediately below the electrode 33 in the n⁻ type semiconductor layer 23 have the equal impurity concentration. The electrode 33 is applied with the voltage higher than that applied to the electrode 32. Therefore, the potential in the region immediately below the electrode 33 in the n⁻ type semiconductor layer 23 is lower than the potential in the region immediately below the electrode 32 in the n type semiconductor layer 23.

The region immediately below the electrode 32 in the n⁻ type semiconductor layer 23 has the p type impurity concentration higher than that of the region immediately below the electrode 33 in the n type semiconductor layer 24. In other words, the region immediately below the electrode 33 in the n type semiconductor layer 24 apparently has the n type impurity concentration higher than that of the region immediately below the electrode 32 in the n⁻ type semiconductor layer 23. Therefore, the potential in the region immediately below the electrode 33 in the n type semiconductor layer 24 is lower than the potential in the region immediately below the electrode 32 in the n⁻ type semiconductor layer 23.

The electrodes 32, 33, a part of the n⁻⁻ type semiconductor layer 22 (end portion in the second direction D2 of the n⁻⁻ type semiconductor layer 22), the n⁻ type semiconductor layer 23, and the n type semiconductor layer 24 constitute the storage unit 3. As described above, the storage unit 3 includes the part of n⁻⁻ type semiconductor layer 22, n⁻ type semiconductor layer 23, and n type semiconductor layer 24 as a plurality of regions in which the impurity concentration is gradually changed in one way in the second direction D2. The storage unit 3 includes the electrodes 32, 33 disposed over the plurality of regions in which the impurity concentration is gradually varied. The potential in the storage unit 3, namely, the potential in the regions immediately below the two electrodes 32, 33 becomes gradually deeper in the second direction D2 as illustrated in FIG. 4.

In the present embodiment, an interface between the n⁻⁻ type semiconductor layer 22 and the n⁻ type semiconductor layer 23 is located in a manner corresponding to a central portion in the second direction D2 of the electrode 32. An interface between the n⁻ type semiconductor layer 23 and the n type semiconductor layer 24 is located in a manner corresponding to a central portion in the second direction D2 of the electrode 33. The number of electrodes 32, 33 in the storage unit 3 is less than the number of the above-described plurality of regions in which the impurity concentration is gradually changed in one way.

A pair of transfer electrodes 34, 35 is disposed adjacent to the electrode 33 in the second direction D2. The transfer electrodes 34, 35 are respectively formed on the n⁻⁻⁻⁻ type semiconductor layer 25 and the n type semiconductor layer 26 via an insulation layer (not illustrated in FIG. 3). The n⁻⁻⁻⁻ type semiconductor layer 25 and the n type semiconductor layer 26 are disposed to be located adjacent to the n type semiconductor layer 24 in the second direction D2.

A signal TG is supplied to the transfer electrodes 34, 35 from a control circuit (not illustrated). Potential depths of the n⁻⁻⁻⁻ type semiconductor layer 25 and the n type semiconductor layer 26 are changed in accordance with the signal TG supplied to the transfer electrodes 34, 35 as illustrated in FIG. 4. Consequently, the charge accumulated in the regions immediately below the electrodes 32, 33 is fed out to the shift register 7. The transfer electrodes 34, 35, n⁻⁻⁻⁻ type semiconductor layer 25, and n type semiconductor layer 26 constitute the transfer unit 5.

A pair of transfer electrodes 36, 37 is disposed adjacent to the transfer electrode 35 in the second direction D2. The transfer electrodes 36, 37 are respectively formed on the n⁻⁻⁻⁻ type semiconductor layer 27 and the n type semiconductor layer 28 via an insulation layer (not illustrated in FIG. 3). The n⁻⁻⁻⁻ type semiconductor layer 27 and the n type semiconductor layer 28 are disposed to be located adjacent to the n type semiconductor layer 26 in the second direction D2.

A signal PH is supplied to the transfer electrodes 36, 37 from a control circuit (not illustrated). Potential depths of the n⁻⁻⁻⁻ type semiconductor layer 27 and the n type semiconductor layer 28 are changed in accordance with the signal PH supplied to the transfer electrodes 36, 37 as illustrated in FIG. 4. Consequently, the charge obtained from the transfer unit 5 is transferred to the output stage 17.

The transfer electrodes 36, 37, type semiconductor layer 27, and n type semiconductor layer 28 constitute the shift register 7.

Figure 5:
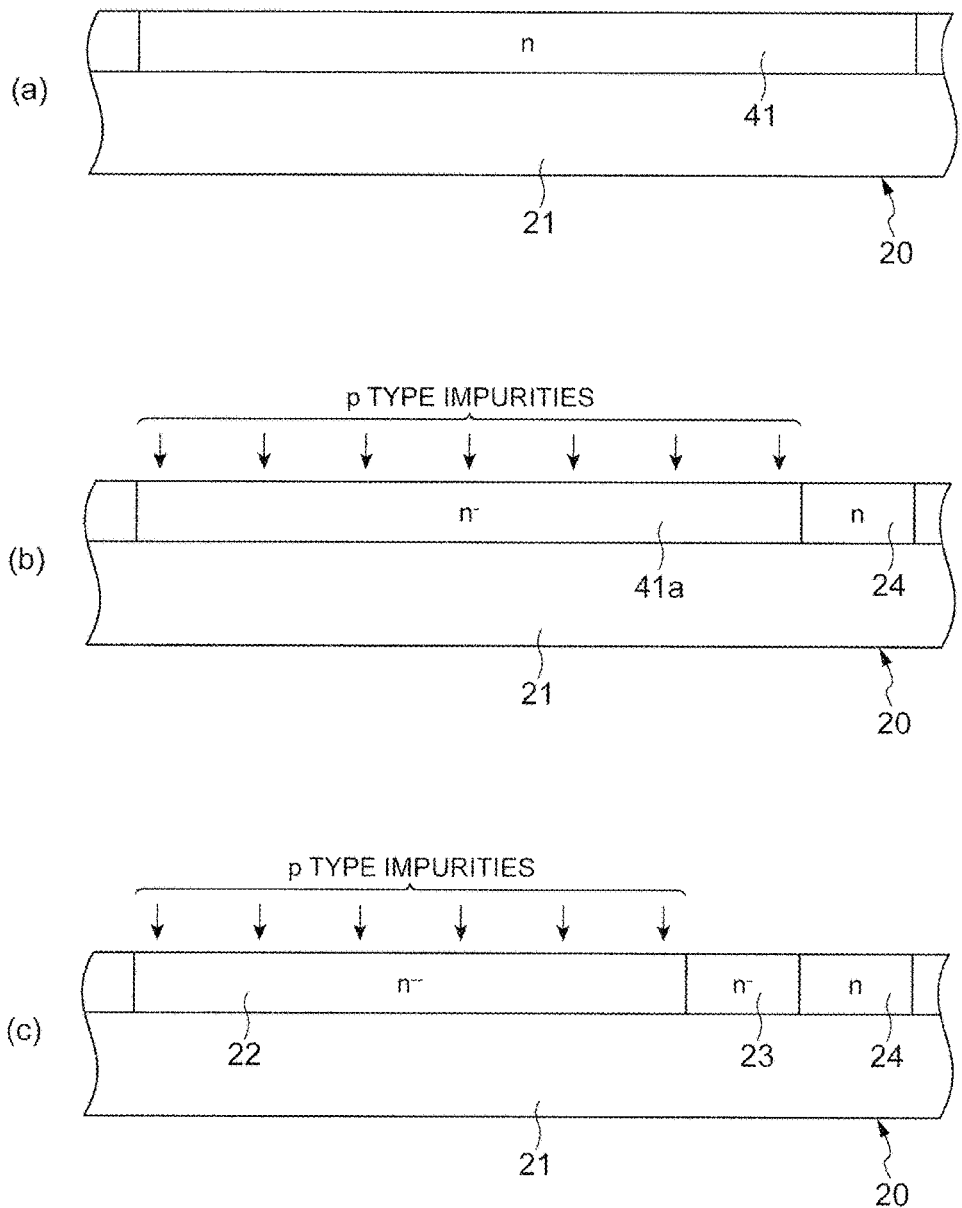
FIG. 5 is a diagram for explaining a forming process of a plurality of regions in the storage unit.
Figure 6:
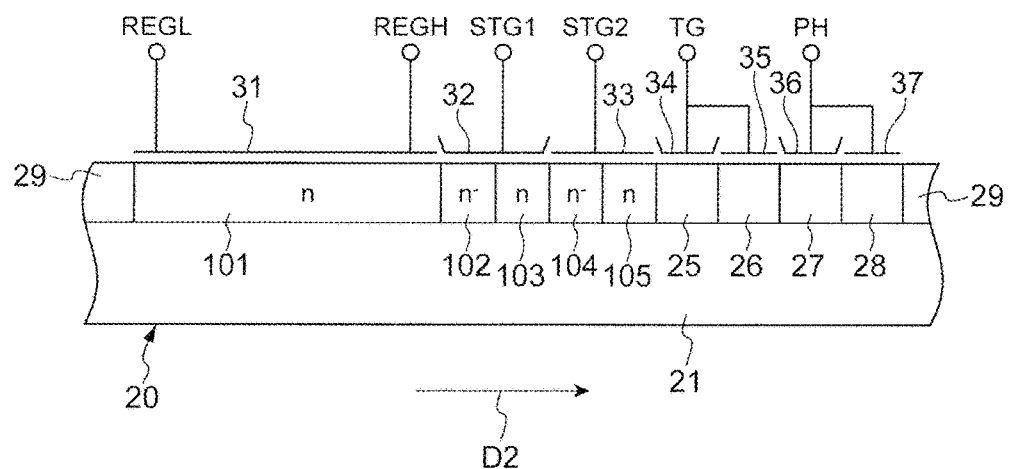
FIG. 6 is a diagram for explaining a comparative example 1.
Figure 6:
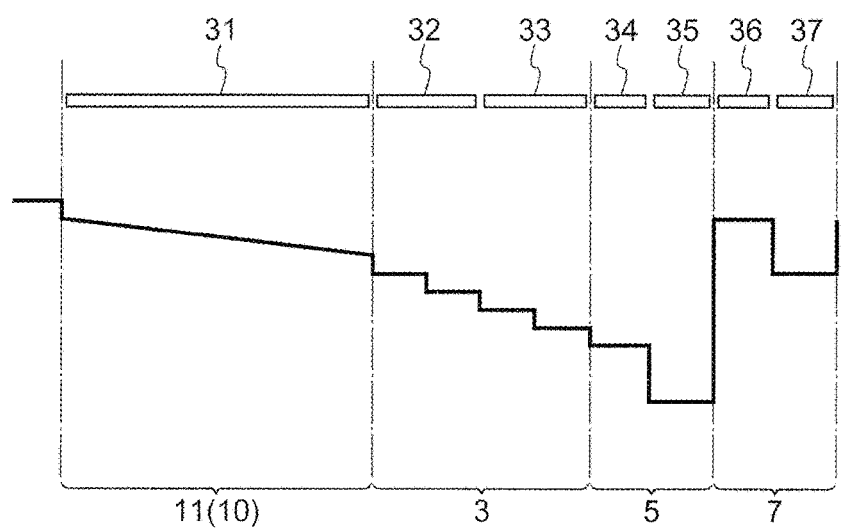
Figure 7:
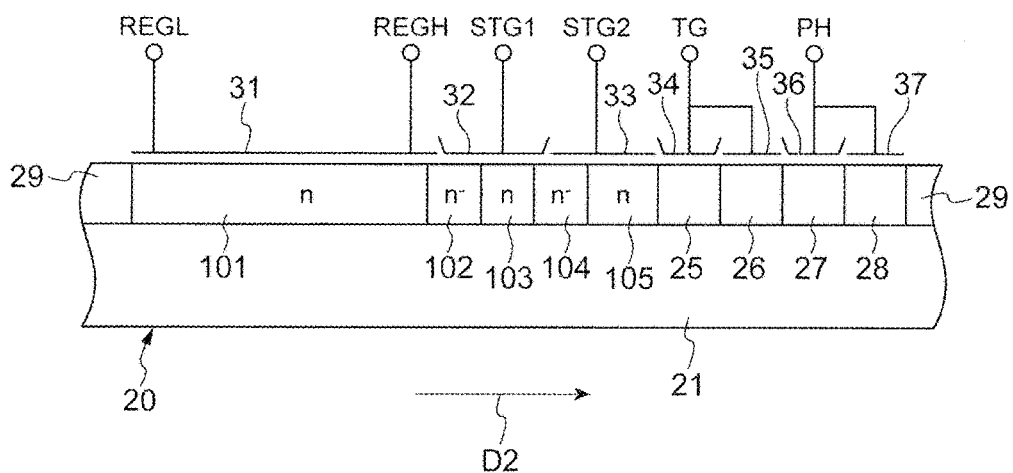
FIG. 7 is a diagram for explaining the comparative example 1.
Figure 7:
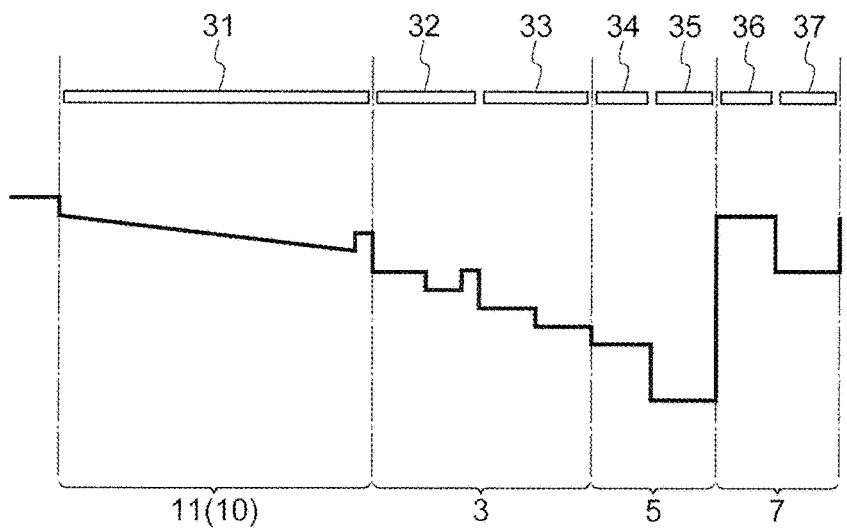
Figure 8:
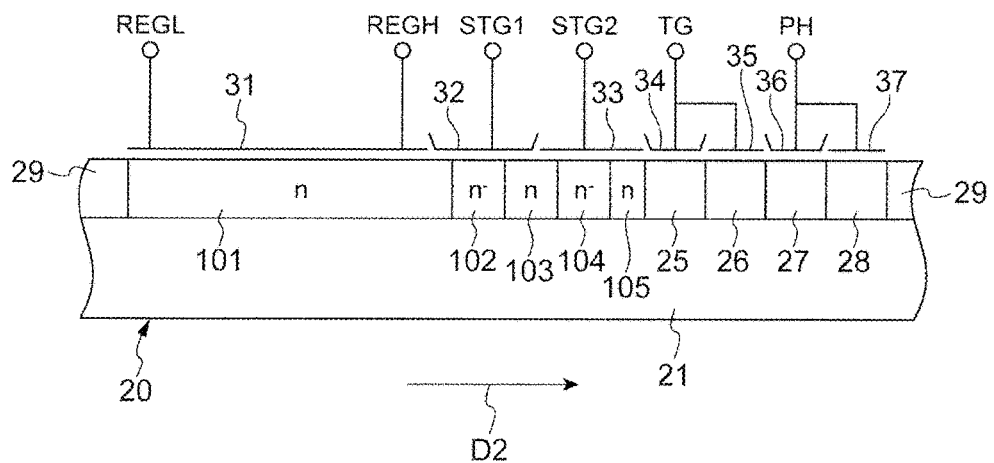
FIG. 8 is a diagram for explaining the comparative example 1.
Figure 8:
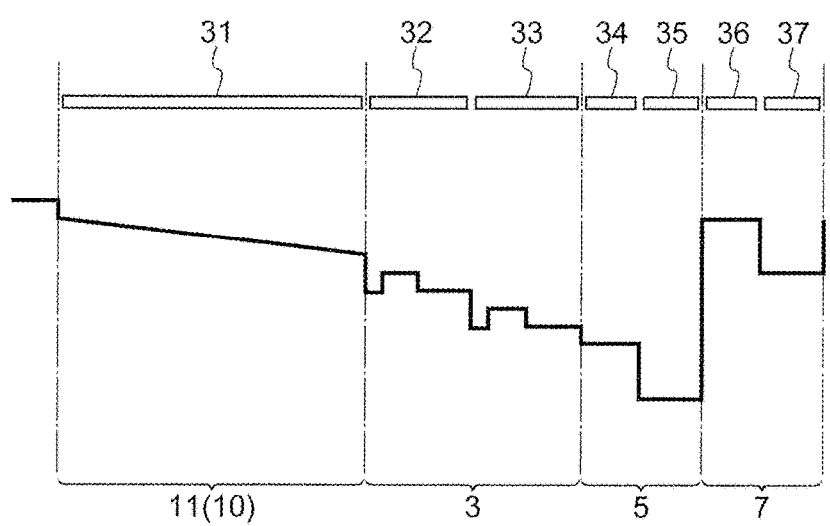
Figure 9:
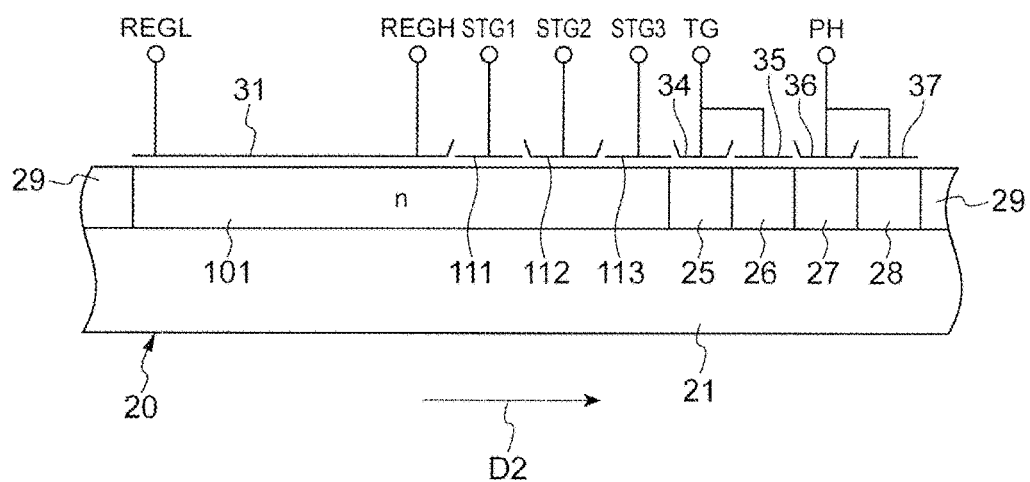
FIG. 9 is a diagram for explaining a comparative example 2.
Figure 9:
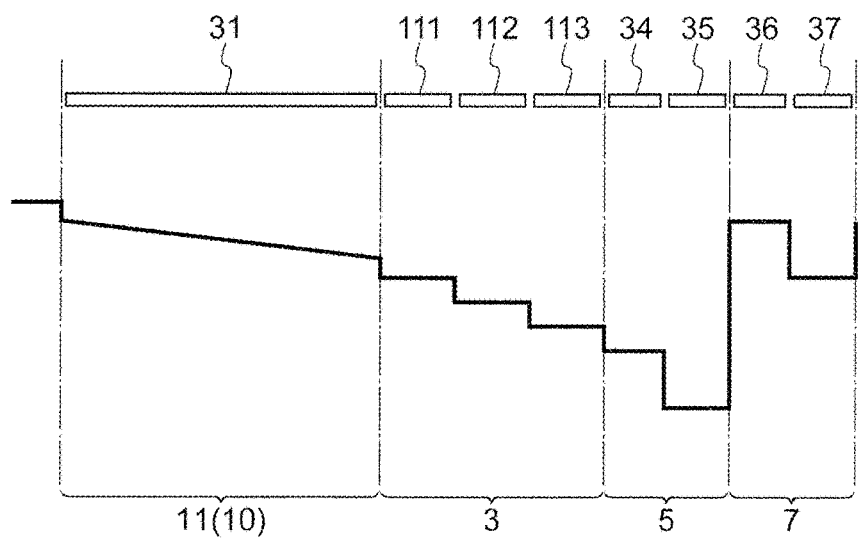

The p$^+$ type semiconductor layer 29 electrically separates the n type semiconductor layers 22, 23, 24, 25, 26, 27, 28 from other portions of the semiconductor substrate 20. The electrodes 31, 32, 33, 34, 35, 36, 37 are made of, for example, polysilicon films. The above-described insulation layer is made of, for example, a silicon oxide film Next, a process of forming the plurality of regions included in the storage unit 3 and having the impurity concentration gradually changed in one way in the second direction D2 will be described with reference to FIG. 5. FIG. 5 is a diagram for explaining the forming process of the plurality of regions in the storage unit.

The semiconductor substrate 20 including, on the one surface side of the p type semiconductor layer 21, the n type semiconductor layer 41 added with n type impurities at a predetermined concentration is prepared. The n type semiconductor layer 41 is a region in order to constitute the photosensitive region 11 and the storage unit 3.

Intended areas where the n$^{--}$ type semiconductor layer 22 and the n$^-$ type semiconductor layer 23 are to be formed in the n type semiconductor layer 41 are added with p type impurities at a predetermined concentration. Here, a mask formed with an opening at a position corresponding to the intended areas of formation is used, and the p type impurities are added through the opening of the mask. In other words, the p type impurities are not added to the intended area where the n type semiconductor layer 24 is to be formed.

Consequently, the region not added with the p type impurities in the n type semiconductor layer 41 is to be the n type semiconductor layer 24. When the p type impurities are added to the n type semiconductor layer 41, the n type impurities are compensated. Consequently, the region added with the p type impurities in the n type semiconductor layer 41 apparently becomes a region having a low concentration of the n type impurities (n$^-$ type semiconductor layer 41a). An ion implantation method and the like are used for adding the impurities.

Next, an intended area where the n$^{--}$ type semiconductor layer 22 is to be formed is further added with p type impurities at a predetermined concentration. Here, a mask formed with an opening at a position corresponding to the intended area of formation is used, and the p type impurities are added through the opening of the mask. Consequently, the region added with the p type impurities once in the n type semiconductor layer 41 is to be the n$^-$ type semiconductor layer 23, and the region added with the p type impurities twice is to be the n$^{--}$ type semiconductor layer 22. The larger the number of adding the p type impurities is, the lower the concentration of the n type impurities apparently becomes.

The plurality of regions in which the impurity concentration is gradually changed in one way in the second direction D2 (n$^{--}$ type semiconductor layer 22, n$^-$ type semiconductor layer 23, and n type semiconductor layer 24) is formed by the above-described process. The n$^{--}$ type semiconductor layer 22 constitutes the photosensitive region 11 and constitutes the storage unit 3. Therefore, an n type impurity concentration in the photosensitive region 11 is equal to an n type impurity concentration in the region of the storage unit 3 adjacent to the photosensitive region 11.

As described above, in the present embodiment, the storage unit 3 includes the plurality of regions in which the impurity concentration is gradually changed in one way in the second direction D2 (n$^{--}$ type semiconductor layer 22, n$^-$ type semiconductor layer 23, and n type semiconductor layer 24) and the electrodes 32, 33. The electrode 32 of the storage unit 3 is disposed over n$^{--}$ type semiconductor layer 22 and the n$^-$ type semiconductor layer 23, and the electrode 33 is disposed over the n$^-$ type semiconductor layer 23 and the n type semiconductor layer 24. Therefore, even in the case where electric fields formed in the middle portions in the second direction D2 of the electrodes 32, 33 are weak, potential depths in the regions immediately below the middle portions of the respective electrodes 32, 33 are properly adjusted because the impurity concentration is gradually changed in one way in the region immediately below the middle portions. Consequently, migration of the charge in the second direction D2 is sufficiently accelerated in the storage unit 3, and transfer time of the charge is shortened. Additionally, size enlargement in the second direction D2 of the storage unit 3 (increase of a saturation charge quantity) is not inhibited.

Here, functions and effects of the above-described present embodiment will be confirmed while making comparison with comparative examples 1 to 3 illustrated in FIGS. 6 to 10. In FIGS. 6 to 10, components same as those of the present embodiment are denoted by the same reference signs in the comparative examples 1 to 3, and descriptions therefor will be omitted. FIGS. 6 to 10 are diagrams for explaining the comparative examples 1 to 3.

The comparative example 1 differs from the present embodiment in relation to a plurality of n type semiconductor layers 101, 102, 103, 104, 105 located immediately below respective electrodes 31, 32, 33 as illustrated in FIG. 6(a). The n type semiconductor layer 101 is located in a region immediately below of the electrode 31 and functions as the photosensitive region 11. The n$^-$ type semiconductor layer 102 and the n type semiconductor layer 103 are located in a region immediately below the electrode 32. The n$^-$ type semiconductor layer 104 and the n type semiconductor layer 105 are located in a region immediately below the electrode 33. In the storage unit 3 of the comparative example 1, an impurity concentration is repeatedly changed in the second direction D2 but not gradually changed in one way. In the plurality of semiconductor layers 101, 102, 103, 104, 105, a potential is formed as illustrated in FIG. 6(b). The potential in the storage unit 3 becomes gradually deeper in the second direction D2.

In the comparative example 1, the n$^-$ type semiconductor layers 102, 104 are formed by adding p type impurities to an n type semiconductor layer via a mask formed with openings at positions corresponding to the n type semiconductor layers 102, 104. At this point, as illustrated in FIG. 7(a) and FIG. 8(a), position displacement may occur between the respective semiconductor layers 102, 103, 104, 105 and the respective electrodes 32, 33 due to misalignment of the above-described mask. When such position displacement occurs, a barrier or well is unexpectedly formed in the potential as illustrated in FIG. 7(b) and FIG. 8(b). Therefore, charge transfer may be inhibited. Since misalignment of the mask is varied by a semiconductor wafer used at the time of manufacturing a solid-state imaging device, performance of the solid-state imaging device is varied between respective semiconductor wafers. Therefore, performance variation becomes large between respective products.

In the present embodiment, the storage unit 3 includes, as the plurality of regions included in the storage unit 3, the part of the n$^{--}$ type semiconductor layer 22 (region located immediately below the electrode 32 in the n$^{--}$ type semiconductor layer 22) and the n$^-$ type semiconductor layer 23 that are aligned in the second direction D2. In the above-mentioned part of the n⁻⁻ type semiconductor layer 22 and the n⁻ type semiconductor layer 23, the impurity concentration is gradually changed in one way by implanting the p type impurities in the intended areas where the n⁻⁻ type semiconductor layer 22 and the n⁻ type semiconductor layer 23 are to be formed in the n type semiconductor layer 41, and further implanting the p type impurities in the intended area where the n⁻⁻ type semiconductor layer 22 are to be formed out of the mentioned intended areas of formation that has been implanted with the p type impurities. A position of an interface between the n⁻⁻ type semiconductor layer 22 and the n⁻ type semiconductor layer 23 in the second direction D2 is located at a middle portion in the second direction D2 of the electrode 32. For this reason, even in the event of misalignment of the mask, neither a barrier nor a well is formed in the potential, and charge transfer is not inhibited. Therefore, performance variation caused by misalignment of the mask may hardly occur between the respective products. Additionally, the plurality of regions in which the impurity concentration is gradually changed in one way in the second direction D2 (n⁻⁻ type semiconductor layer 22, n⁻ type semiconductor layer 23, and n type semiconductor layer 24) can be easily achieved.

In the present embodiment, the n⁻⁻ type semiconductor layer 22 constitutes the photosensitive region 11 and the storage unit 3. In other words, the n⁻⁻ type semiconductor layer 22 includes the region located immediately below the electrode 31 and constituting the photosensitive region 11 and the region located immediately below the electrode 32 and constituting the storage unit 3, and both of the regions have the equal impurity concentration. The region constituting the photosensitive region 11 (n⁻⁻ type semiconductor layer 22) apparently has an n type impurity concentration lower than that of the n type semiconductor layer 101 in the comparative example 1. Therefore, compared to the n type semiconductor layer 101, the potential formed in the region immediately below the electrode 31 in the n⁻⁻ type semiconductor layer 22 is high. The potential forming over the storage unit 3 and the transfer unit 5 is deeper compared to the comparative example 1. Therefore, charge transfer is more smoothly performed. Neither a barrier nor a well of the potential is hardly formed between the photosensitive region 11 and the storage unit 3, and charge transfer from the photosensitive region 11 to the storage unit 3 can be prevented from being inhibited.

As illustrated in FIG. 9(a), the comparative example 2 differs from the present embodiment in relation to a plurality of electrodes 111, 112, 113 included in the storage unit 3 and the n type semiconductor layer 101 located immediately below the plurality of electrodes. The n type semiconductor layer 101 is located in a region immediately below the electrode 31 and the electrodes 111, 112, 113 and functions as the photosensitive region 11 and the storage unit 3. In other words, a part of the n type semiconductor layer 101 and the plurality of electrodes 111, 112, 113 constitute the storage unit 3. Different voltages (STG1, STG2, STG3) are applied the respective electrodes 111, 112, 113, and a potential is formed in the n type semiconductor layer 101 as illustrated in FIG. 9(b). The potential in the storage unit 3 becomes gradually deeper in the second direction D2.

In the comparative example 2, the number of the electrodes 111, 112, 113 is needed to be the same as the number of grades of the potential formed in the storage unit 3, and signal lines are needed to be connected to the respective electrodes 111, 112, 113. Therefore, the structure may be complex. The size in the second direction D2 of the storage unit 3 may be enlarged by a space where the electrodes 111, 112, 113 are disposed. In which case, the size in the second direction D2 of the storage unit 3 may be larger than a size based on a request for increase of the saturation charge quantity.

In contrast, in the present embodiment, the number of electrodes 32, 33 is less than the number of the grades of the potential formed in the storage unit 3, and the number of signal lines to be connected to the electrodes 32, 33 is also less. Therefore, in the present embodiment, the structure of the solid-state imaging device SI is simple, and manufacturing the solid-state imaging device SI is also easy. The size in the second direction D2 of storage unit 3 is prevented from being larger than the size based on the request for increase of the saturation charge quantity.

Figure 10:
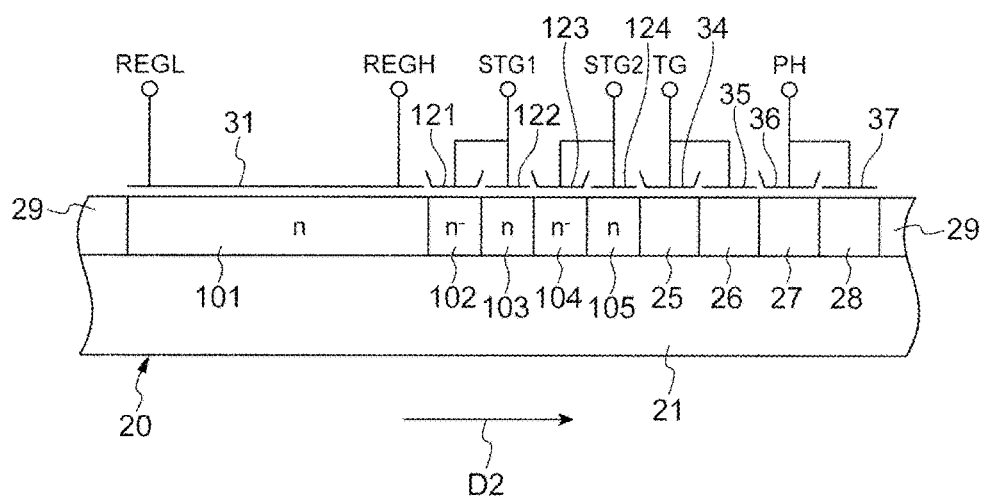
FIG. 10 is a diagram for explaining a comparative example 3.

As illustrated in FIG. 10, the comparative example 3 differs from the present embodiment in relation to respective electrodes 121, 122, 123, 124 and a plurality of n type semiconductor layers 101, 102, 103, 104, 105 located immediately below these electrodes 121, 122, 123, 124. The n⁻ type semiconductor layer 102 is located in a region immediately below the electrode 121, and the n type semiconductor layer 103 is located in a region immediately below the electrode 122. The n⁻ type semiconductor layer 104 is located in a region immediately below the electrode 123, and the n type semiconductor layer 105 is located in a region immediately below the electrode 124. The same voltage (STG1) is applied to the electrode 121 and the electrode 122, and the same voltage (STG2) is applied to the electrode 123 and the electrode 124.

In the comparative example 3, the electrode 31, electrode 122, and electrode 124 are formed, and then the n⁻ type semiconductor layers 102, 104 are formed by adding p type impurities to the n type semiconductor layer while adopting the electrodes 31, 122, 124 as masks. In other words, the n⁻ type semiconductor layers 102, 104 are formed by self-alignment. Therefore, mask misalignment does not occur like the comparative example 1, and neither a barrier nor a well is unexpectedly formed in a potential.

The comparative example 3 has a structure in which the plurality of electrodes 121, 122, 123, 124 is concentrated in a narrow region. Therefore, there are many constraints in design, for example, a wiring space for signal lines connected to the respective electrodes 121, 122, 123, 124 are needed to be secured. In the comparative example 3, same as the comparative example 2, the size in the second direction D2 of the storage unit 3 may become larger than the size based on the request for increase of saturation charge quantity.

In contrast, in the present embodiment, the structure of the solid-state imaging device SI is simple, and manufacturing the solid-state imaging device SI is also easy as described above. The size in the second direction D2 of storage unit 3 is prevented from being larger than the size based on the request for increase of the saturation charge quantity.

As described above, the present embodiment provides excellent functions and effects, compared with the comparative examples 1 to 3. In other words, according to the solid-state imaging device SI of the present embodiment, both increase of the saturation charge quantity and speed-up of charge transfer can be achieved at a high level.

Figure 11:
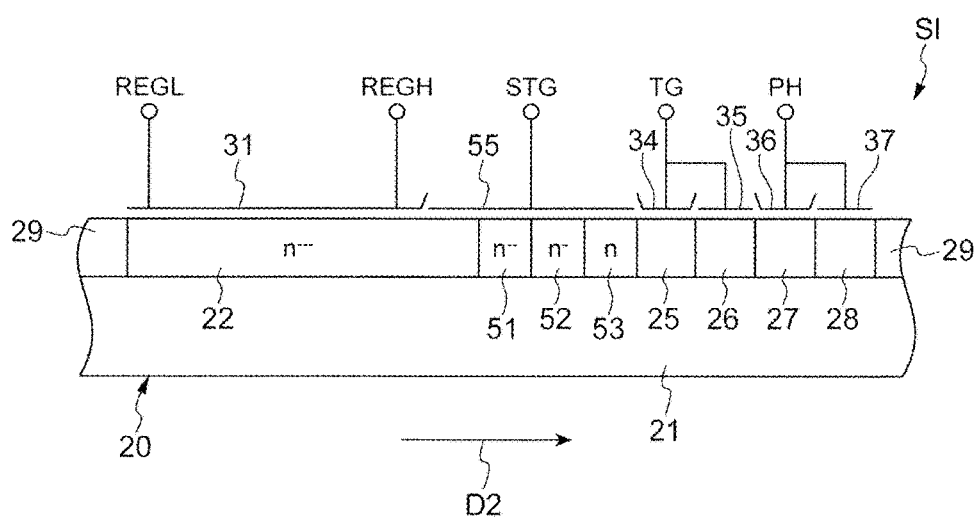
FIG. 11 is a schematic diagram illustrating a sectional configuration of a solid-state imaging device according to a modified example of the present embodiment.
Figure 12:
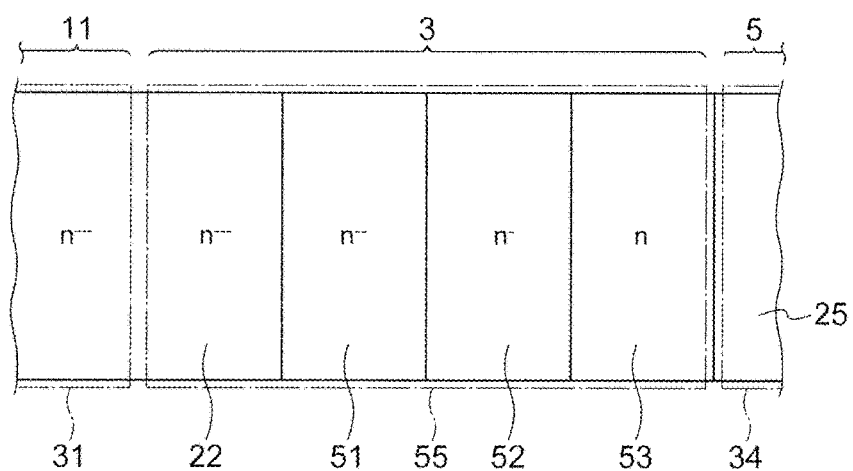
FIG. 12 is a diagram for explaining a configuration of a storage unit.

Next, a modified example of the present embodiment will be described with reference to FIGS. 11 and 12. FIG. 11 is a schematic diagram illustrating a sectional configuration of a solid-state imaging device according to the modified example of the present embodiment. FIG. 12 is a diagram for explaining a configuration of a storage unit.

The semiconductor substrate 20 included in the solid-state imaging device SI according to the present modified example includes a p type semiconductor layer 21, an $n^{---}$ type semiconductor layer 22, an $n^{--}$ type semiconductor layer 51, an $n^{-}$ type semiconductor layer 52, n type semiconductor layers 53, 26, 28, $n^{----}$ type semiconductor layers 25, 27, and $p^{+}$ type semiconductor layer 29. An electrode 55 is disposed for the $n^{---}$ type semiconductor layer 22, $n^{--}$ type semiconductor layer 51, $n^{-}$ type semiconductor layer 52, and n type semiconductor layer 53 as also illustrated in FIG. 12.

The electrode 55 is adjacent to the electrode 31 in the second direction D2. The electrode 55 is formed on the $n^{---}$ type semiconductor layer 22, $n^{--}$ type semiconductor layer 51, $n^{-}$ type semiconductor layer 52, and n type semiconductor layer 53 via an insulation layer (not illustrated in FIG. 11) to be disposed over the $n^{---}$ type semiconductor layer 22, $n^{--}$ type semiconductor layer 51, $n^{-}$ type semiconductor layer 52, and n type semiconductor layer 53. The electrode 55 is made of, for example, a polysilicon film. The above-described insulation layer is made of, for example, a silicon oxide film A voltage (STG) higher than the voltages applied to both ends of the electrode 31 is applied to the electrode 55.

The $n^{--}$ type semiconductor layer 51 is adjacent to the $n^{---}$ type semiconductor layer 22 in the second direction D2. The $n^{-}$ type semiconductor layer 52 is adjacent to the $n^{--}$ type semiconductor layer 51 in the second direction D2. The n type semiconductor layer 53 is adjacent to the $n^{-}$ type semiconductor layer 52 in the second direction D2. The $n^{----}$ type semiconductor layer 25 is adjacent to the n type semiconductor layer 53 in the second direction D2.

A region immediately below the electrode 55 in the $n^{---}$ type semiconductor layer 22 has a p type impurity concentration higher than that of the $n^{--}$ type semiconductor layer 51. In other words, the $n^{--}$ type semiconductor layer 51 apparently has an n type impurity concentration higher than the region immediately below the electrode 55 in the $n^{---}$ type semiconductor layer 22. The $n^{--}$ type semiconductor layer 51 has the p type impurity concentration higher than that of the $n^{-}$ type semiconductor layer 52. The $n^{-}$ type semiconductor layer 52 has the p type impurity concentration higher than that of the n type semiconductor layer 53. In other words, the n type semiconductor layer 53 apparently has the n type impurity concentration higher than that of the $n^{-}$ type semiconductor layer 52. The $n^{-}$ type semiconductor layer 52 apparently has the n type impurity concentration higher than that of the $n^{--}$ type semiconductor layer 51.

The electrode 55, a part of the $n^{---}$ type semiconductor layer 22 (end portion in the second direction D2 in then type semiconductor layer 22), $n^{--}$ type semiconductor layer 51, $n^{-}$ type semiconductor layer 52, and the n type semiconductor layer 53 constitute the storage unit 3.

As described above, the storage unit 3 includes the part of $n^{---}$ type semiconductor layer 22, $n^{--}$ type semiconductor layer 51, $n^{-}$ type semiconductor layer 52, and n type semiconductor layer 53 as a plurality of regions in which the impurity concentration is gradually changes in one way in the second direction D2. Furthermore, the storage unit 3 includes the electrode 55 disposed over the plurality of regions in which the impurity concentration is gradually varied. The potential in the storage unit 3, namely, the potential in the region immediately below the electrode 55 becomes gradually deeper in the second direction. D2.

Figure 13:
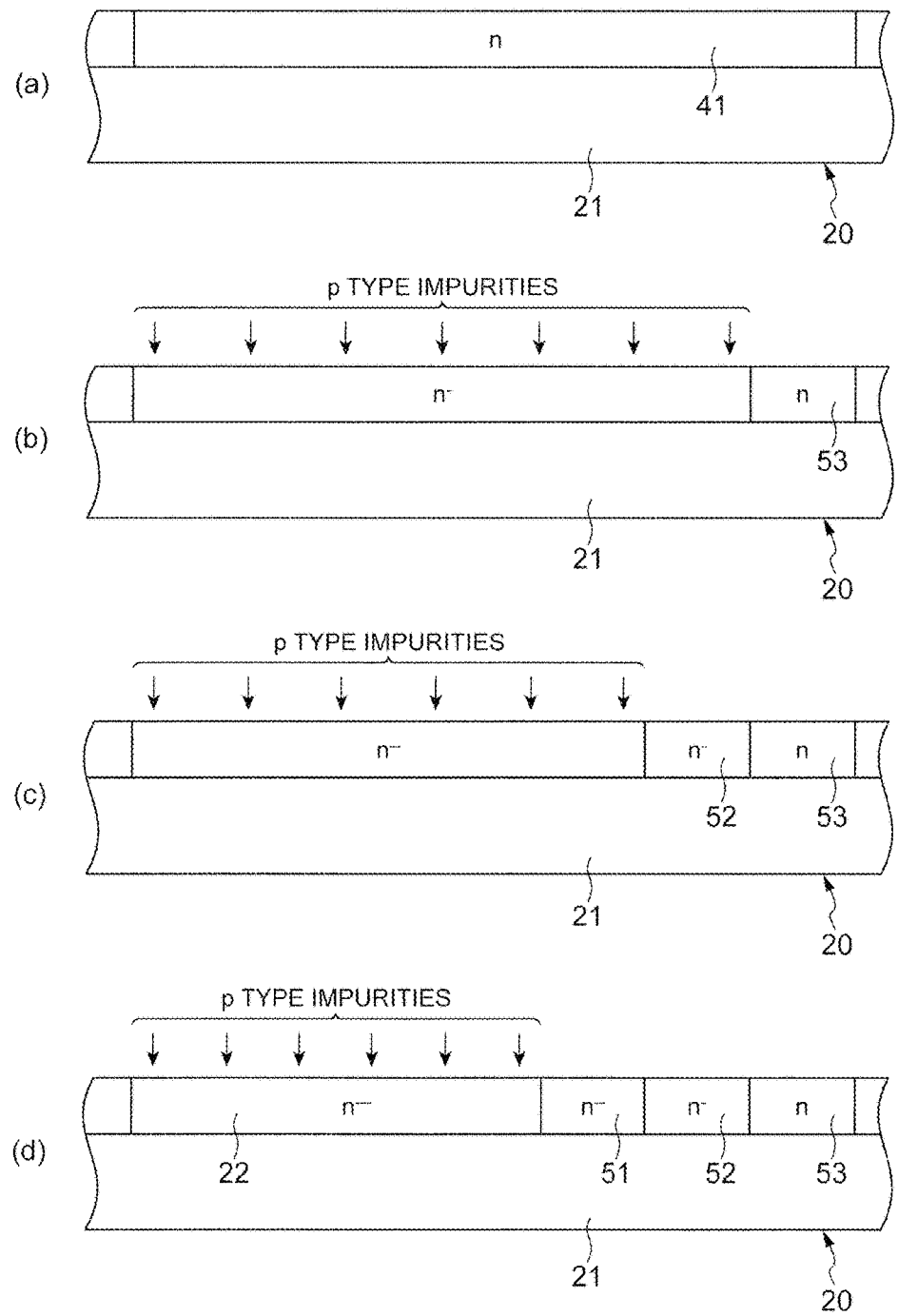
FIG. 13 is a diagram for explaining a forming process of a plurality of regions in the storage unit.

Next, a process of forming the plurality of regions included in the storage unit 3 of the modified example and having the impurity concentration gradually changed in one way in the second direction D2 will be described with reference to FIG. 13. FIG. 13 is a diagram for explaining the forming process of the plurality of regions in the storage unit.

The semiconductor substrate 20 including, on the one surface side of the p type semiconductor layer 21, the n type semiconductor layer 41 added with the n type impurities at a predetermined concentration is prepared. Then, intended areas where the $n^{---}$ type semiconductor layer 22, $n^{--}$ type semiconductor layer 51, and $n^{-}$ type semiconductor layer 52 are to be formed in the n type semiconductor layer 41 are added with p type impurities at a predetermined concentration. Here, a mask formed with an opening at a position corresponding to the intended areas of formation is used, and the p type impurities are added through the opening of the mask. In other words, the p type impurities are not added to the intended area where the n type semiconductor layer 53 is to be formed. Consequently, the region not added with the p type impurities in the n type semiconductor layer 41 is to be the n type semiconductor layer 53.

Next, intended areas where the $n^{---}$ type semiconductor layer 22 and the $n^{--}$ type semiconductor layer 51 are to be formed are further added with p type impurities at a predetermined concentration. Here, a mask formed with an opening at a position corresponding to the intended areas of formation is used, and the p type impurities are added through the opening of the mask. After that, an intended area where $n^{---}$ type semiconductor layer 22 is to be formed is further added with p type impurities at a predetermined concentration. Here also, the mask formed with an opening at the position corresponding to the intended area of formation is used, and the p type impurities are added through the opening of the mask. Consequently, the region added with the p type impurities once in the n type semiconductor layer 41 is to be the $n^{-}$ type semiconductor layer 52, and the region added with the p type impurities twice is to be the $n^{--}$ type semiconductor layer 51, and the region added with the p type impurities three times is to be the $n^{---}$ type semiconductor layer 22.

The plurality of regions in which the impurity concentration is gradually changed in one way in the second direction D2 ($n^{---}$ type semiconductor layer 22, $n^{--}$ type semiconductor layer 51, $n^{-}$ type semiconductor layer 52, and .n type semiconductor layer 53) is formed by the above-described process.

As described above, in the present modified example, the storage unit 3 includes the plurality of regions in which the impurity concentration is gradually changed in one way in the second direction D2 ($n^{---}$ type semiconductor layer 22, $n^{--}$ type semiconductor layer 51, $n^{-}$ type semiconductor layer 52, and n type semiconductor layer 53) and the electrode 55. The electrode 55 of the storage unit 3 is disposed over the $n^{---}$ type semiconductor layer 22, $n^{--}$ type semiconductor layer 51, $n^{-}$ type semiconductor layer 52, and n type semiconductor layer 53. Therefore, even in the case where an electric field formed in a middle portion in the second direction D2 of the electrode 55 is weak, a potential depth in the region immediately below the middle portion of the electrode 55 is properly adjusted because the impurity concentration is gradually changed in one way in the region immediately below the middle portion. Consequently, in the present modified example also, both increase of the saturation charge quantity and speed-up of charge transfer can be achieved at a high level.

Next, solid-state imaging devices according to modified examples of the present embodiment will be described with reference to FIGS. 14 to 17. FIGS. 14 to 17 are diagrams for explaining configurations of the solid-state imaging devices according to modified examples of the present embodiment.

Figure 14:
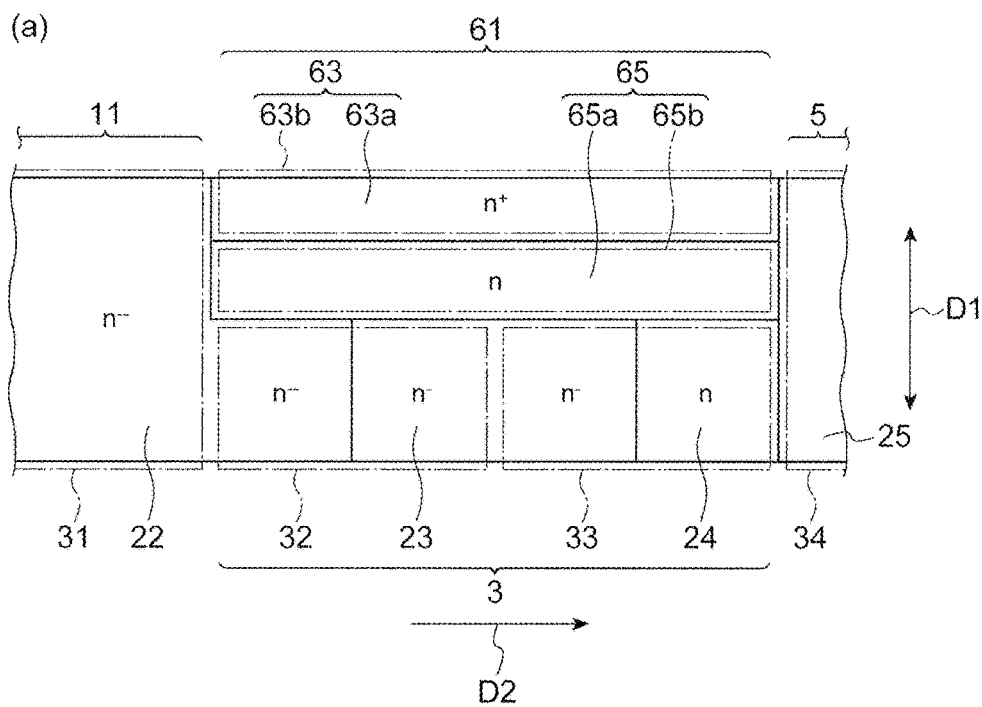
FIG. 14 is a diagram for explaining a configuration of a solid-state imaging device according to a modified example of the present embodiment.
Figure 14:
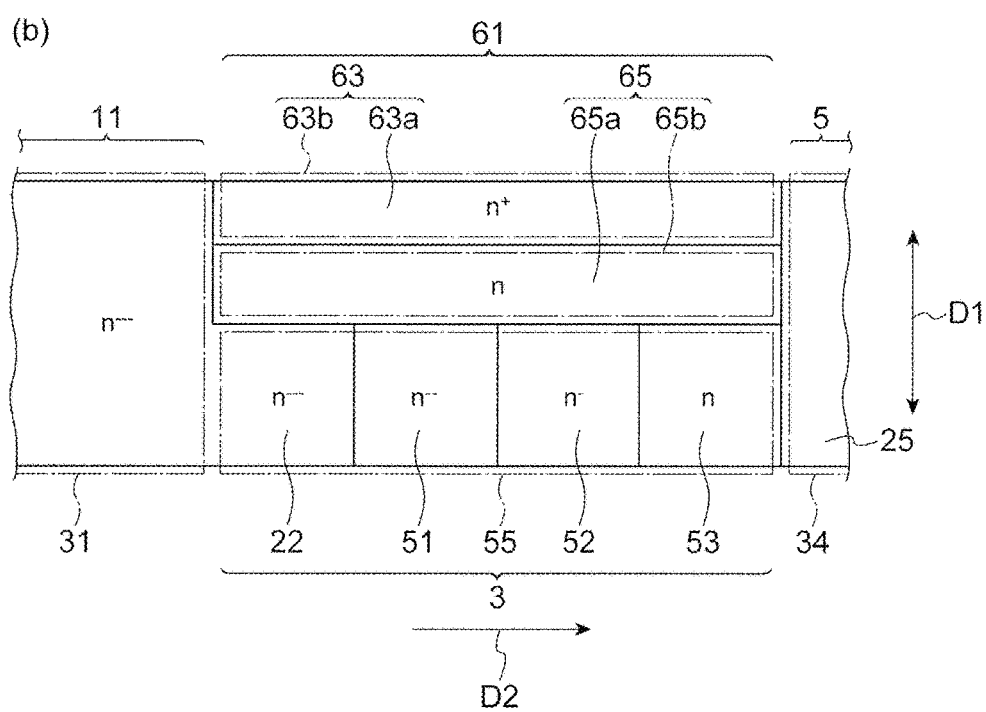

The solid-state imaging device illustrated in FIG. 14 includes a plurality of charge-discharging units 61 aligned with the respective storage units 3 in the first direction and adapted to discharge the charge accumulated in the storage unit 3. Each of the charge-discharging units 61 includes a drain region 63 adapted to discharge a charge and a gate region 65 located between the storage unit 3 and the drain region 63. The gate region 65 controls flow of the charge into the drain region 63 from the storage unit 3. The drain region 63 includes an $n^+$ type semiconductor layer 63a and an electrode 63b electrically connected to the $n^+$ type semiconductor layer 63a. The $n^+$ type semiconductor layer 63a has an n type impurity concentration higher than that of the storage unit 3. The gate region 65 includes an n type semiconductor layer 65a adjacent to the storage unit 3 in the first direction D1 and an electrode 65b disposed on the n type semiconductor layer 65a. The n type semiconductor layer 65a has the n type impurity concentration lower than that of the $n^+$ type semiconductor layer 63a.

In the case where an electric potential lower than reference is applied to the gate electrode 65b, a potential barrier is formed in the n type semiconductor layer 65a. Consequently, flow of the charge from the storage unit 3 to the drain region 63 is restricted. In the case where an electric potential higher than a reference potential is applied to the gate electrode 65b, no potential barrier is formed in the n type semiconductor layer 65a. Consequently, the charge flows to the drain region 63 (n type semiconductor layer 63a) and is discharged.

In the present modified example, when the charge exceeding accumulation capacity of the storage unit 3 is generated in the storage unit 3, the charge exceeding the accumulation capacity is discharged by the charge-discharging unit 61. Consequently, the charge exceeding the accumulation capacity and overflowed from the storage unit 3 can be prevented from being leaked to another storage unit 3, so-called blooming.

Figure 15:
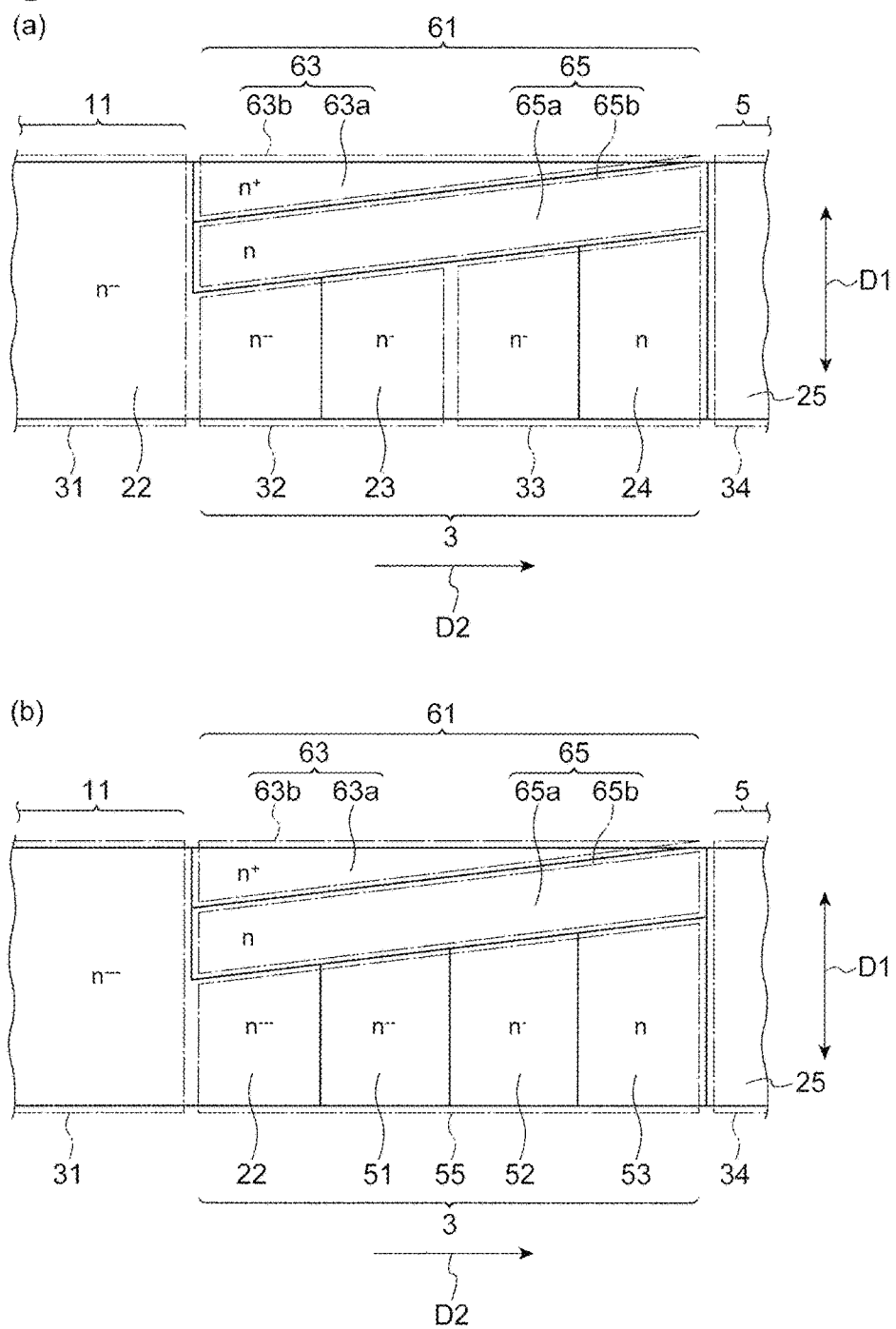
FIG. 15 is a diagram for explaining a configuration of a solid-state imaging device according to a modified example of the present embodiment.

In the solid-state imaging device illustrated in FIG. 15, a width of the storage unit 3 is enlarged in the first direction D1 as a position advances in the second direction D2. In the present modified example, the charge-discharging unit 61 can be disposed without inhibiting the flow of the charge directed to the transfer unit 5 from the storage unit 3, namely, the flow of charge in the second direction D2 from the storage unit 3.

Figure 16:
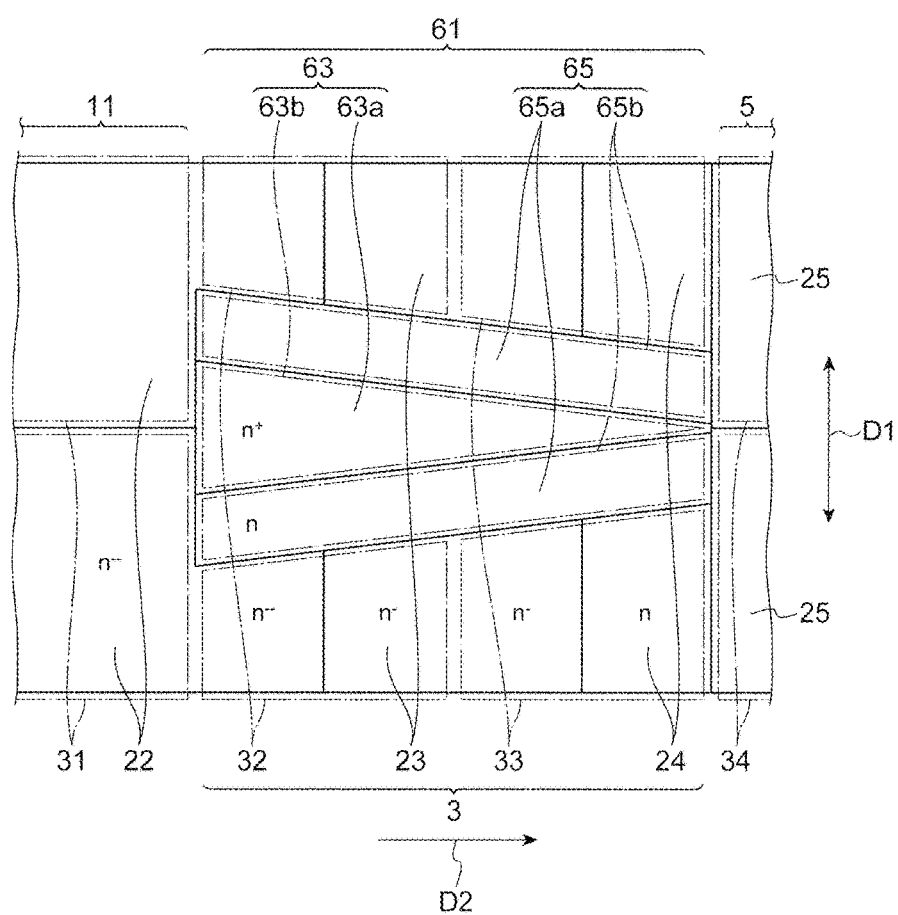
FIG. 16 is a diagram for explaining a configuration of a solid-state imaging device according to a modified example of the present embodiment.
Figure 17:
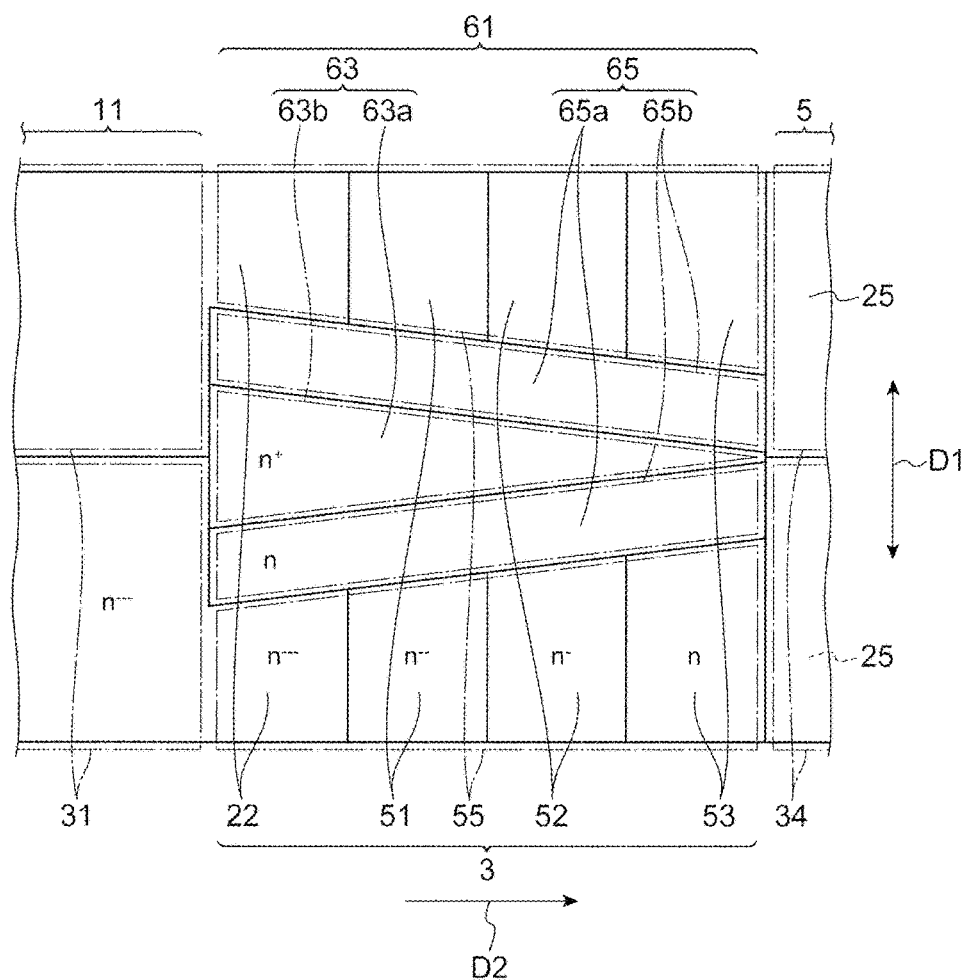
FIG. 17 is a diagram for explaining a configuration of a solid-state imaging device according to a modified example of the present embodiment.

In the solid-state imaging devices illustrated in FIGS. 16 and 17, the drain region 63 ($n^+$ type semiconductor layer 63a) is shared between the charge-discharging units 61 adjacent to each other in the first direction D1. With this configuration, space saving for the charge-discharging units 61 can be achieved. In the modified example illustrated in FIG. 14 also, the drain region 63 ($n^+$ type semiconductor layer 63a) may be shared between the charge-discharging units 61 adjacent to each other in the first direction D1.

In the solid-state imaging device according to the modified example illustrated in FIG. 18(a), the storage unit 3 includes a plurality of regions in which the impurity concentration is gradually changed in one way in the second direction D2 (n type semiconductor layer 22, $n^+$ type semiconductor layer 23, and $n^{++}$ type semiconductor layer 24) and the electrodes 32, 33. In the storage unit 3, the $n^+$ type semiconductor layer 23 is a region added with the n type impurities once, and the $n^{++}$ type semiconductor layer 24 is a region added with the n type impurities twice. The electrode 32 of the storage unit 3 is disposed over the n type semiconductor layer 22 and the $n^+$ type semiconductor layer 23, and the electrode 33 is disposed over the $n^+$ type semiconductor layer 23 and the $n^{++}$ type semiconductor layer 24. Therefore, same as the present embodiment, a potential in the storage unit 3 becomes gradually deeper in the second direction D2.

In the solid-state imaging device according to the modified example illustrated in FIG. 18(b), the storage unit 3 includes a plurality of regions in which the impurity concentration is gradually changed in one way in the second direction D2 (n type semiconductor layer 22, $n^+$ type semiconductor layer 51, $n^{++}$ type semiconductor layer 52, and $n^{+++}$ type semiconductor layer 53) and the electrode 55. In the storage unit 3, the $n^+$ type semiconductor layer 51 is a region added with the n type impurities once, the $n^{++}$ type semiconductor layer 52 is a region added with the n type impurities twice, and the $n^{+++}$ type semiconductor layer 53 is a region added with the n type impurities three times. The electrode 55 of the storage unit 3 is disposed over the n type semiconductor layer 22, $n^+$ type semiconductor layer 51, $n^{++}$ type semiconductor layer 52, and $n^{+++}$ type semiconductor layer 53. Therefore, same as the modified examples illustrated in FIGS. 11 and 12, a potential in the storage unit 3 becomes gradually deeper in the second direction D2.

Figure 18:
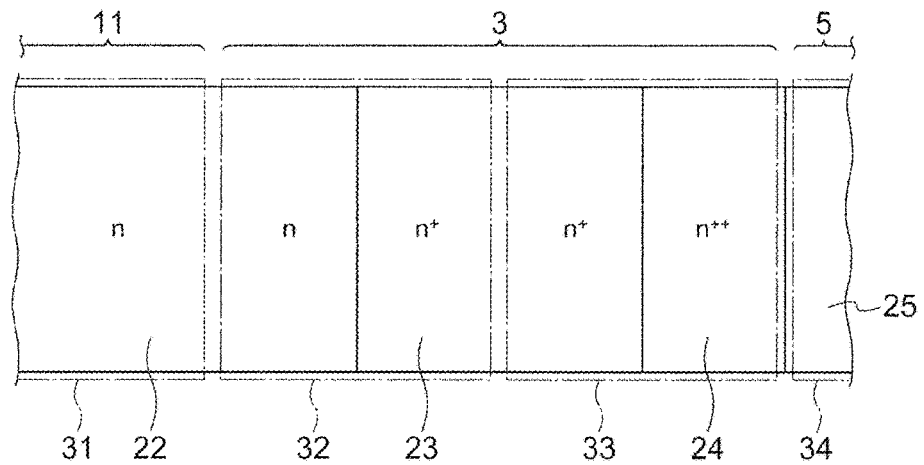
FIG. 18 is a diagram for explaining a configuration of a solid-state imaging device according to a modified example of the present embodiment.
Figure 18:
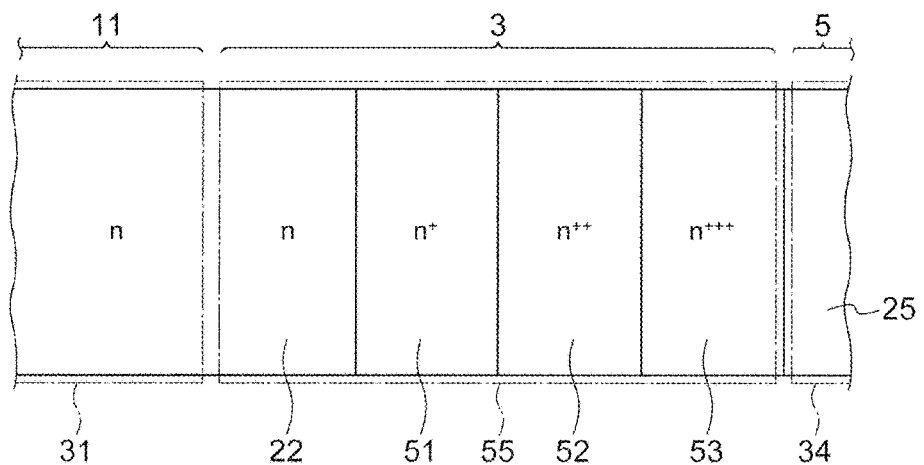

In the modified example illustrated in FIG. 18, the plurality of regions (n type semiconductor layer 22, $n^+$ type semiconductor layer 23, and $n^{++}$ type semiconductor layer 24) in which the impurity concentration is gradually changed in one way in the second direction. D2 is formed by adding the n type impurities. In the present modified example also, both increase of the saturation charge quantity and speed-up of charge transfer can be achieved at a high level.

The above described the embodiments of the present invention but it should be noted that the present invention does not always have to be limited to the foregoing embodiments and can be modified in many ways without departing from the scope and spirit of the invention.

For example, in the storage unit 3, the number of regions in which the impurity concentration is gradually changed in one way in the second direction D2 is not limited to the above-described embodiment and modified examples. The number of electrodes included in the storage unit 3 is also not limited to the number in the above-described embodiment and modified examples.

INDUSTRIAL APPLICABILITY

The present invention can be applicable to a solid-state imaging device such as a CCD liner image sensor.

REFERENCE SIGNS LIST

3: storage unit, 5: transfer unit, 7: shift register, 10: photoelectric converting unit, 11: photosensitive region, 13: electric potential gradient forming unit, 20: semiconductor substrate, 22: $n^{--}$ type semiconductor layer, $n^{---}$ type semiconductor layer, n type semiconductor layer, 23: $n^-$ type semiconductor layer, $n^+$ type semiconductor layer, 24: n type semiconductor layer, $n^{++}$ type semiconductor layer, 31, 32, 33, 55: electrode, 51: $n^{--}$ type semiconductor layer, $n^+$ type semiconductor layer, 52: $n^-$ type semiconductor layer, $n^{++}$ type semiconductor layer, 53: n type semiconductor layer, $n^{+++}$ type semiconductor layer, 61: charge-discharging unit, 63: drain region, 65: gate region, D1: first direction, D2: second direction, SI: solid-state imaging device.

The invention claimed is:

1. A solid-state imaging device comprising:
a plurality of photoelectric converting units aligned in a first direction;
a plurality of charge-accumulating units, each being aligned with a corresponding photoelectric converting unit in a second direction orthogonal to the first direction, and each being configured to accumulate a charge generated in the corresponding photoelectric converting unit;
a charge-output unit configured to obtain charges respectively transferred from the plurality of charge-accumulating units, and transfer in the first direction, to output the charges; and
a plurality of transfer units, each being disposed between a corresponding charge-accumulating unit of the plurality of charge-accumulating units and the charge-output unit in the second direction, and each being configured to obtain the charge accumulated in the corresponding charge-accumulating unit and transfer the obtained charge to the charge-output unit,
each of the photoelectric converting units including:
a photosensitive region configured to generate the charge in accordance with light incidence; and
an electric potential gradient forming unit configured to form, for the photosensitive region, an electric potential gradient increasing along the second direction, the electric potential gradient forming unit being configured to accelerate migration of the charge in the second direction in the photosensitive region, and
each of the charge-accumulating units including:
a plurality of regions, including a first region, a second region, and a third region, in which an impurity concentration is gradually changed in one way in the second direction, wherein the plurality of regions are disposed in an order of the first region, the second region, and the third region in the second direction; and
an electrode, including a first electrode and a second electrode, disposed over the plurality of regions in which the impurity concentration is gradually varied, and configured to apply an electric field to the plurality of regions, wherein the first electrode is disposed over the first region and the second region, the second electrode is disposed over the second region and the third region, and wherein the second electrode is applied with a voltage higher than that applied to the first electrode.

2. The solid-state imaging device according to claim 1, wherein the impurity concentration is gradually changed in one way in the first region and the second region by implanting impurities in the first region and the second region and additionally implanting the impurities in the first region having been implanted with the impurities.

3. The solid-state imaging device according to claim 2, wherein the first region is adjacent to the photosensitive region in the second direction, and
wherein the photosensitive region has an impurity concentration the same as the impurity concentration of the first region by implanting impurities together with the first region.

4. The solid-state imaging device according to claim 1, further comprising:
a plurality of charge-discharging units, each being aligned with a corresponding charge-accumulating unit in the first direction, and each being configured to discharge the charge accumulated in the corresponding charge-accumulating unit.

5. The solid-state imaging device according to claim 4, wherein each of the charge-accumulating units has a width enlarged in the first direction as a position advances in the second direction.

6. The solid-state imaging device according to claim 4, wherein each of the charge-discharging units includes:
a drain region configured to discharge a charge;
a gate region located between the charge-accumulating unit and the drain region and configured to control flow of the charge into the drain region from the charge-accumulating unit, and
the drain region is shared between the charge-discharging units adjacent to each other in the first direction.

* * * * *